(12) United States Patent
Huang et al.

(10) Patent No.: US 10,651,313 B2
(45) Date of Patent: May 12, 2020

(54) REDUCED TRANSISTOR RESISTANCE USING DOPED LAYER

(71) Applicant: Intel Corporation, Santa Clara, CA (US)

(72) Inventors: Cheng-Ying Huang, Portland, OR (US); Matthew V. Metz, Portland, OR (US); Gilbert Dewey, Hillsboro, OR (US); Willy Rachmady, Beaverton, OR (US); Jack T. Kavalieros, Portland, OR (US); Sean T. Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,423

(22) PCT Filed: Sep. 30, 2016

(86) PCT No.: PCT/US2016/054889
§ 371 (c)(1),
(2) Date: Feb. 14, 2019

(87) PCT Pub. No.: WO2018/063363
PCT Pub. Date: Apr. 5, 2018

(65) Prior Publication Data
US 2019/0214500 A1 Jul. 11, 2019

(51) Int. Cl.
*H01L 27/088* (2006.01)
*H01L 29/786* (2006.01)
(Continued)

(52) U.S. Cl.
CPC ........ *H01L 29/78609* (2013.01); *B82Y 10/00* (2013.01); *H01L 21/823437* (2013.01); *H01L 27/088* (2013.01); *H01L 27/2454* (2013.01); *H01L 29/0673* (2013.01); *H01L 29/0847* (2013.01); *H01L 29/41725* (2013.01);
(Continued)

(58) Field of Classification Search
CPC .......................... H01L 21/02518; H01L 29/68
See application file for complete search history.

(56) References Cited

U.S. PATENT DOCUMENTS 7,407,847 B2   8/2008  Doyle et al.
9,412,865 B1   8/2016  Kerber et al.
(Continued)

OTHER PUBLICATIONS

The International Searching Authority, Written Opinion of the International Searching Authority and the International Search Report dated Jun. 21, 2017 in International Application No. PCT/US2016/054889, eight pages.

*Primary Examiner* — Cheung Lee
(74) *Attorney, Agent, or Firm* — Trop, Pruner & Hu, P.C.

(57) ABSTRACT

An embodiment includes a transistor comprising: first, second, and third layers each including a group III-V material; a channel included in the second layer, which is between the first and third layers; and a gate having first and second gate portions; wherein (a)(i) the first and third layers are doped, (a)(ii) the channel is between the first and second gate portions and the second gate portion is between the channel and a substrate, (a)(iii) a first axis intersects the first, second, and third layers but not the first gate portion, and (a)(iv) a second axis, parallel to the first axis, intersects the first and second gate portions and the channel. Other embodiments are described herein.

23 Claims, 7 Drawing Sheets

(51) Int. Cl.

| | |
|---|---|
| *H01L 29/06* | (2006.01) |
| *H01L 29/423* | (2006.01) |
| *B82Y 10/00* | (2011.01) |
| *H01L 29/66* | (2006.01) |
| *H01L 29/775* | (2006.01) |
| *H01L 29/78* | (2006.01) |
| *H01L 29/417* | (2006.01) |
| *H01L 21/8234* | (2006.01) |
| *H01L 29/08* | (2006.01) |
| *H01L 27/24* | (2006.01) |

(52) U.S. Cl.
CPC ........ *H01L 29/42392* (2013.01); *H01L 29/66* (2013.01); *H01L 29/66469* (2013.01); *H01L 29/66522* (2013.01); *H01L 29/66742* (2013.01); *H01L 29/775* (2013.01); *H01L 29/785* (2013.01); *H01L 29/78618* (2013.01); *H01L 29/78648* (2013.01); *H01L 29/78681* (2013.01); *H01L 29/78696* (2013.01); *H01L 29/41733* (2013.01)

(56) References Cited

U.S. PATENT DOCUMENTS

| | | |
|---|---|---|
| 2003/0111686 A1 | 6/2003 | Nowak |
| 2006/0035442 A1 | 2/2006 | Ilicali et al. |
| 2008/0303080 A1 | 12/2008 | Bhattacharyya |
| 2010/0276668 A1 | 11/2010 | Ko et al. |

REDUCED TRANSISTOR RESISTANCE USING DOPED LAYER

TECHNICAL FIELD

Embodiments of the invention are in the field of semiconductor devices and, in particular, non-planar transistors.

BACKGROUND

As addressed in U.S. Pat. No. 7,407,847 (assigned to Intel Corp. of Santa Clara, Calif., U.S.A.) a tri-gate transistor includes a thin semiconductor body (e.g., a silicon fin) formed on a substrate. A gate dielectric is formed on the top surface and the sidewalls of the fin. A gate electrode is formed on the surface of the gate dielectric on the top surface and the sidewalls of the fin. Source and drain regions are formed in the fin on opposite sides of the gate electrode. Because the gate electrode and the gate dielectric surround the semiconductor body on three sides, the transistor essentially has three separate gates. These three separate gates provide three separate channels for electrical signals to travel, thus effectively tripling the conductivity as compared to a conventional planar transistor.

Tri-gate transistors generally have superior performance to bulk gate devices. This is because of the proximity of the top and side gates to each other, which, as the fin thins, causes full depletion and results in steeper sub-threshold gradients (SG) and smaller drain induced barrier lowering (DIBL).

The SG and DIBL typically are used to determine short-channel effects (SCEs) in a transistor. In general, it is desired that SCEs are low such that the transistor off-state leakage current, Ioff (i.e., a current flowing between source and drain regions when a transistor is in an off state), remains as low as possible. A steeper SG and/or reduced DIBL indicates lower Ioff, and thus smaller and better SCEs.

Generally, the thinner the fin the smaller and better the SCEs. However, thinner fins suffer from large external resistance (Rext), which causes reduced drive current. Rext is primarily present in the source/drain nodes due to the thinness of the fin that includes those nodes. The reduction in drive current may be measured by a change in Idsat, which is the saturated current flowing through the drain. DIBL decreases substantially as a fin thins indicating an improvement in the SCEs. However, at the same time, the thinner fin suffers greater Rext.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
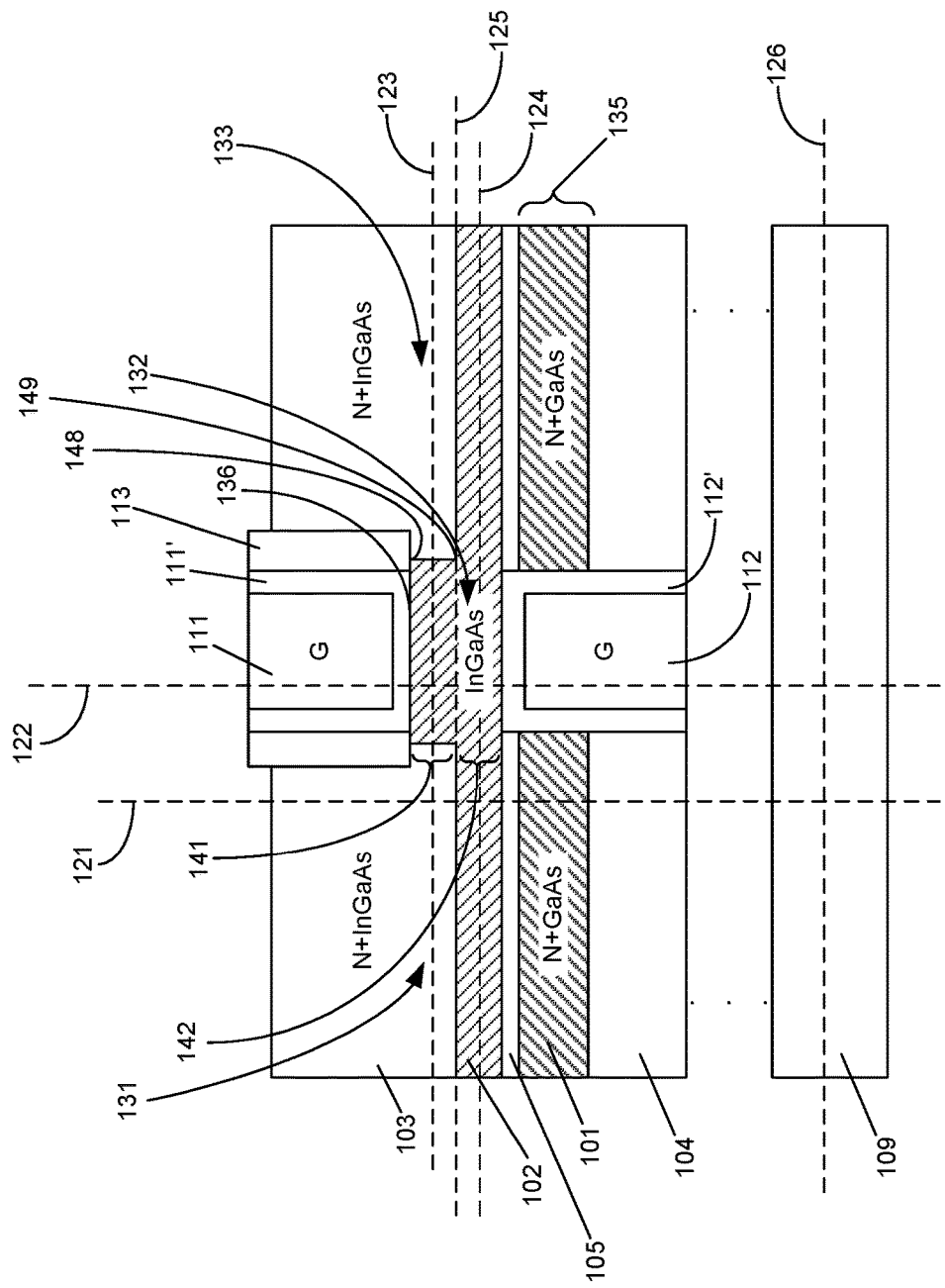
FIG. 1 includes an embodiment of a low source/drain resistance switching device.
Figure 2A:
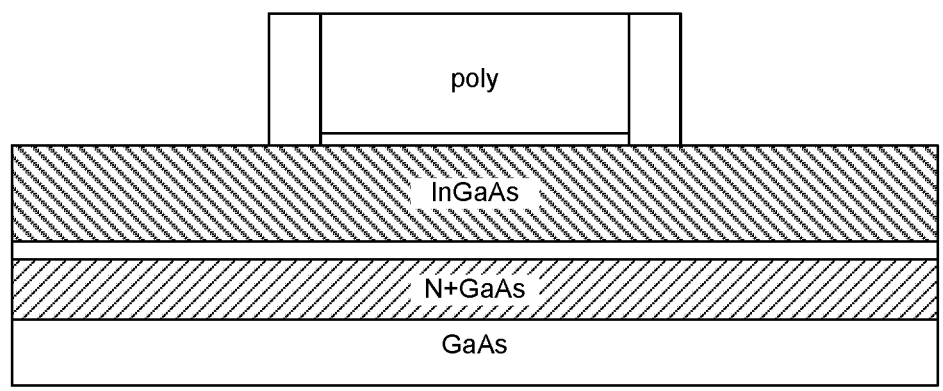
FIGS. 2(a)-2(d) include a method of forming a low source/drain resistance switching device in an embodiment.
Figure 2B:
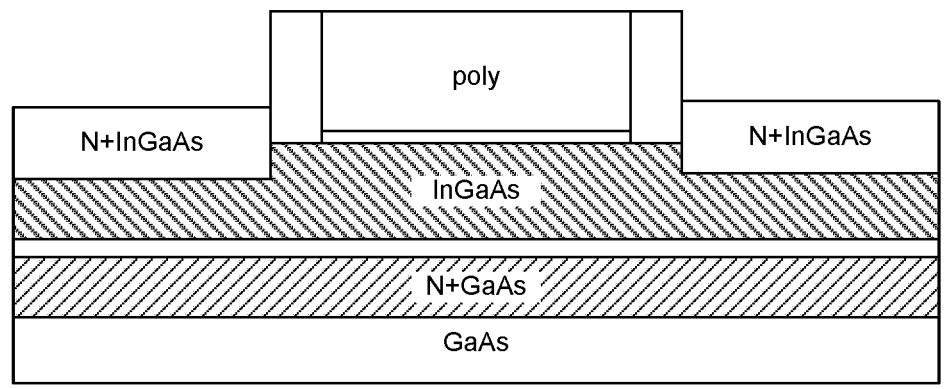
Figure 2C:
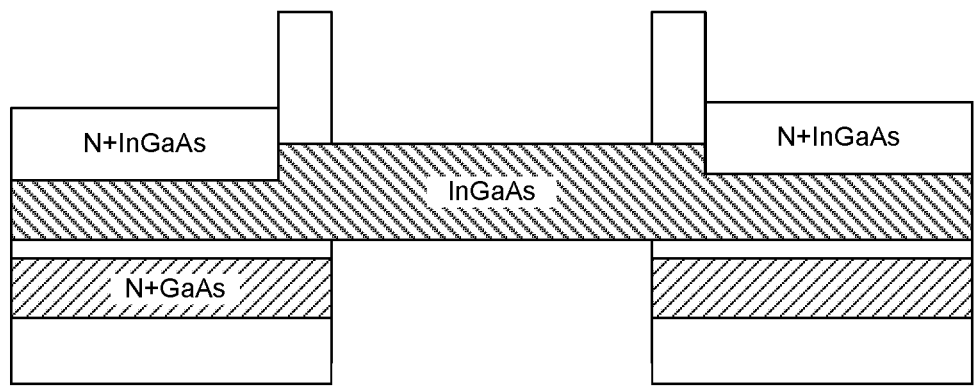
Figure 2D:
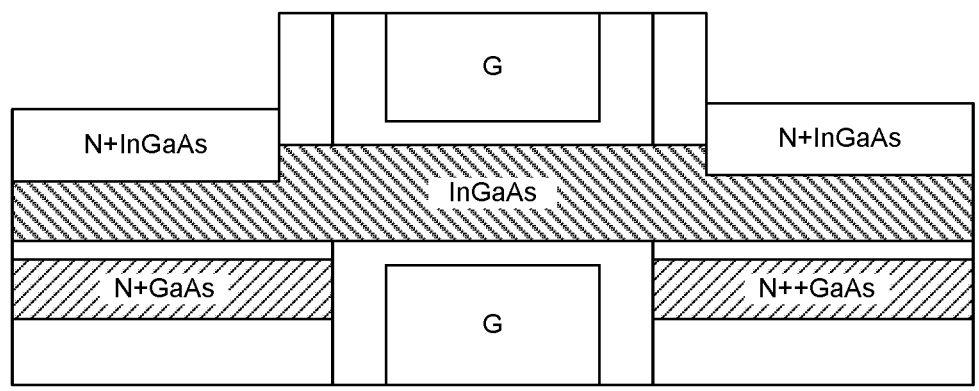

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Applicant has determined the above issue regarding Rext is not limited to tri-gate devices but also present in other forms of fin-based transistors. A FinFET is a transistor built around a thin strip of semiconductor material (referred to as the "fin"), such as the above described tri-gate device. Other types of FinFETs exist, such as "double-gate" FinFETs in which the conductive channel principally resides only along both sidewalls of the fin and not along the top side of the fin. A Gate-All-Around (GAA) device includes a gate electrode formed around all four sides of the fin. A GAA device effectively has four separate gates on the top, bottom, and both sidewalls of the fin. Gate control of the GAA device may be generally better than a double-gate device or a tri-gate device. A GAA may couple to a nanowire, which is a general term referring to strongly two-dimensionally confined (ultra-small diameter in deep sub-100 nm regime) pieces of a solid in the form of tubes, rods, and similar elongated cylindrical structures. Nanowires have very high surface to volume ratio and may include the channel of a transistor.

As addressed herein, Applicant has determined Rext increases as fin width decreases for not only tri-gate devices but for other multi-gate devices as well. Embodiments address, for example, GAA/nanowire devices with reduced Rext. Such embodiments may further provide reduced transistor off-state leakage current.

FIG. 1 includes an embodiment of a low source/drain resistance switching device 100. Device 100 comprises a substrate 109; a layer 101 including a doped material that includes at least one of a group III-V material and a group IV material (e.g., GaAs); a layer 102 including a material (e.g., InGaAs) that includes at least one of a group III-V material and a group IV material; and a layer 103 including a doped material (e.g., InGaAs) that includes at least one of a group III-V material and a group IV material. Device 100 further includes gate portions 111, 112, gate oxide portions 111', 112' and, in some embodiments, spacers layers 113 and the like.

In an embodiment layer 101 is doped with Si, Ge, and/or Sn but in other embodiments it may be doped with Te and the like. In an embodiment layer 103 is doped with Si, Ge, and/or Sn but in other embodiments it may be doped with Te and the like. In an embodiment the materials of layers 102, 103 each have the same chemical elements irrespective of doping elements included in layer 103. For example, each of layers 102, 103 may include In, Ga, As to form InGaAs (even though the InGaAs of layer 103 may be doped with another element). In an embodiment one of the materials in layers 101, 102 includes a chemical element that is not present in another of the layers 101, 102 irrespective of doping elements included in layer 101. For example, layer 102 may include A, B, C and layer 101 may only include A and B but not C. In an embodiment layer 101 can be any III-V material that can be doped the same type as layer 103. For example, layer 101 can be GaAs, InP, InAs, InAlAs, and the like. In an embodiment, layers 101, 103 are doped a similar amount but that is not so in other embodiments.

In an embodiment layers 101, 102, 103 are not monolithic with each other. For example, each of the layers may be formed in a sequence but not simultaneously. Layer 103 may constitute recessed source and drains wherein a portion of layer 102 is removed and then layer 103 is formed in the recessed portion of layer 102. Layer 103, when being formed within recessed areas, may include the exact same chemical composition of layer 102 but may be doped or at least doped more significantly than layer 102.

Axis 121 intersects layers 101, 102, 103 but not gate portions 111, 112. Axis 122, parallel to axis 121, intersects gate portions 111, 112 and channel 132, which is included in layer 102. Axis 122 does not intersect layers 101, 103.

Layer 102 includes a first half 141 and a second half 142. Axis 123, orthogonal to axis 102, intersects the first half 141 and layer 103. Axis 124, parallel to axis 123, intersects the second half 142 but does not intersect the third layer 103 due to the relatively shallow recess of source/drain regions 131, 133. In an embodiment, axis 125, parallel to axis 123, separates the first half 141 from the second half 142. Layer 103 does not extend to a height that is between axes 124, 125. The shallow recess (e.g., going less than half way down the second layer 102 so as not to go below axis 125) is possible due to contributions from the doped material of layer 101 (i.e., carriers need not be doped deeply to bottom of layer 102 if carriers are available to the channel from below in layer 101).

Regarding doping, doped layer 101 has a height 135, defined by the axis 101 (i.e., measured orthogonal to main axis 126 of substrate 109. Doping entails the introduction of dopant into a semiconductor for the purpose of altering its electrical properties. Doping allows control of resistivity/conductivity of a semiconductor by several orders of magnitude. Doping may also be used to convert p-type material into n-type material and vice versa. A dopant includes an element introduced into a semiconductor to establish either p-type (acceptors) or n-type (donors) conductivity. Embodiments use dopants that include p-type dopants (e.g., boron) and/or n-type dopants (e.g., phosphorous, arsenic, antimony). Other embodiments may use Si, Ge, Sn, and/or Te as n-type dopants and C, Zn, Mg, and/or Be as p-type dopants. The doping may occur via in situ doping where dopant atoms are introduced into the semiconductor during its growth (e.g., during epitaxial growth of semiconductor layers 101, 103).

The doping may occur using modulation doping. Modulation doping may include doping of a heterostructure (e.g. AlGaAs—GaAs) implemented in such way that the resulting free electrons are spatially separated from the positive donor ions. As a result scattering of moving electrons on the dopant atoms is avoided. Also, due to the separation, electrons remain free and mobile even at the very low temperatures.

The doping may occur using delta doping, which entails formation of doped layers which are atomic-layer thick. This may occur in the course of Molecular Beam Epitaxy (MBE). With delta doping, height 135 may be only one monolayer in height but may also be any amount less than 1 nm. Delta doping may be thicker than one monolayer due to, for example, dopant diffusion. However, where thicker doping is desired, pulse doping may be used. For example, in such a case height 135 may be at least 2 nm. However, in other embodiments it may be as thick as 30 nm. Regardless of doping technique, height may be 1, 2, 3, 4, 5, 6, 7, 8, 9 nm or more.

In an embodiment, gate elements 111, 112 form a multi-gate portion of a FinFET. For example, they may form a dual gate FinFET or GAA gate (whereby side gate portions not shown in FIG. 1 would be included).

While not shown in FIG. 1, device 100 may further include a dielectric layer (e.g., SiO2) that includes a trench. The trench may include layers 101, 102 and other components of device 100.

Device 100 may include other layers not discussed in detail herein, such as layer 104 between substrate 109 and first layer 101. Layer 104 may include GaAs but in other embodiments may include AlAs, InP, InAlAs, InGaP, AlSb, AlAsSb, and/or GaAsSb. Device 100 may include layer 105 between layers 101, 102. Layer 105 may include a material having the same chemical components/composition as the material of layer 104. In FIG. 1 both layers 104, 105 include GaAs. Layer 105 may help, for example, control electron scattering from layer 101.

Figure 3:
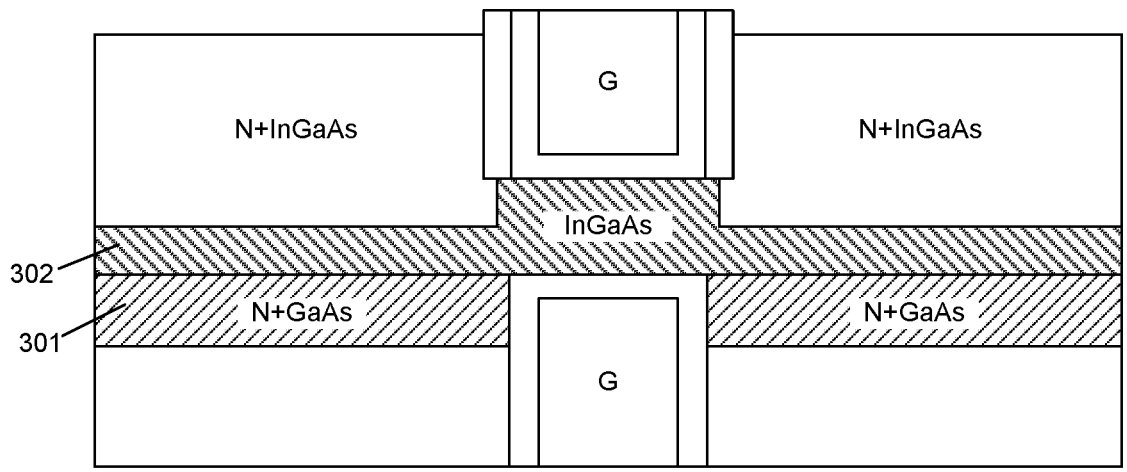
FIG. 3 includes a low source/drain resistance switching device in an embodiment.

However, in other embodiments layer 105 is omitted. For example, FIG. 3 includes an embodiment similar to that of FIG. 1 (so similar components are not discussed again) but omits layer 105 so layer 301 directly contacts layer 302. FIG. 3 shows a buffer layer 301 that is pulse doped.

Figure 4:
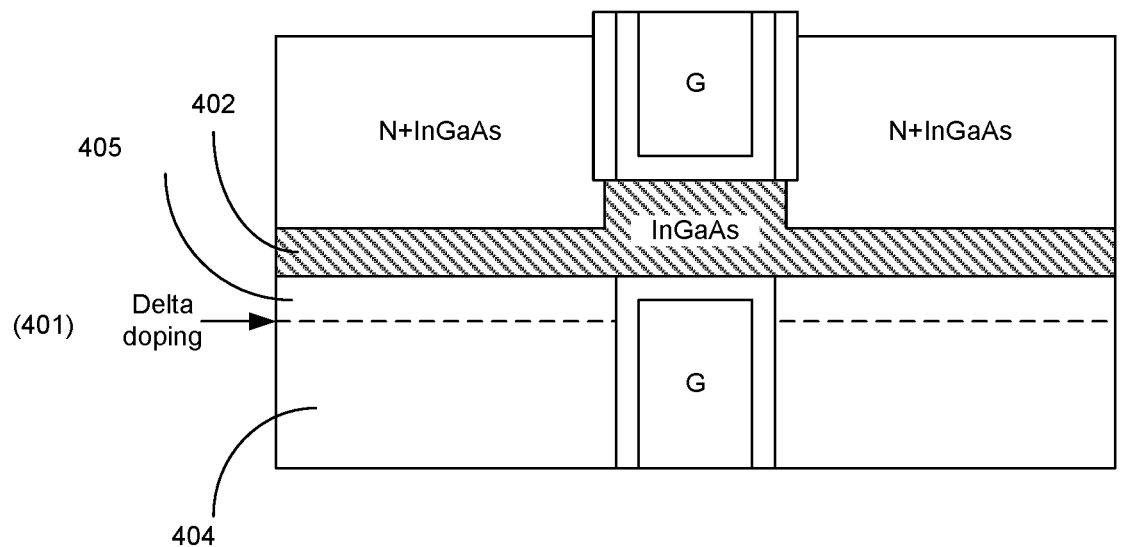
FIG. 4 includes a low source/drain resistance switching device in an embodiment based on delta doping.

Returning to the above discussion regarding delta doping, FIG. 4 includes an embodiment similar to that of FIG. 1 (so similar components are not discussed again). However, FIG. 4 shows an example whereby delta doped layer 401 is very thin and located between layers 404, 405 and below layer 402.

Figure 5:
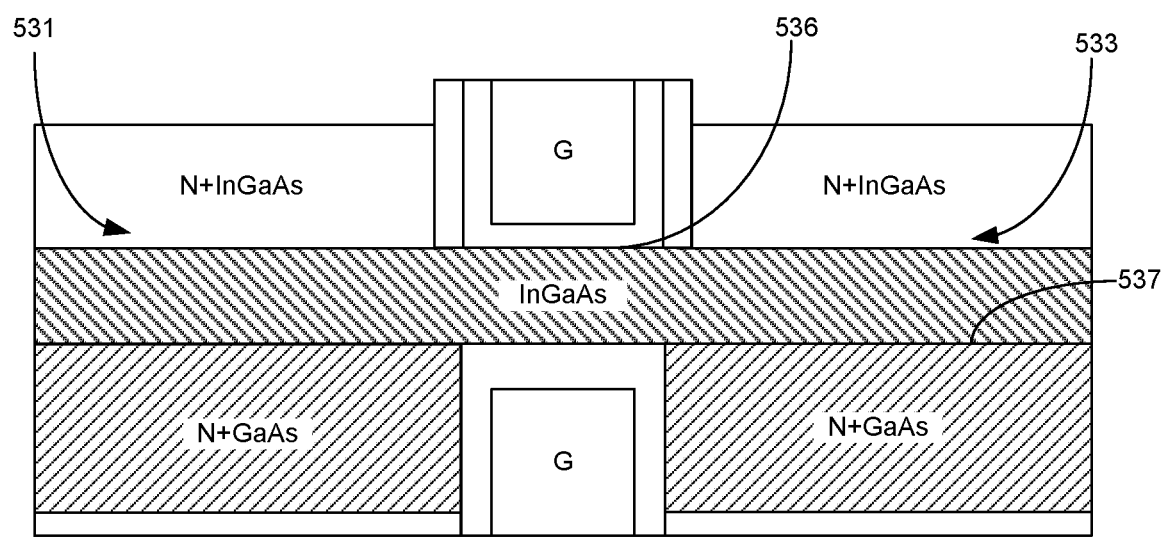
FIG. 5 includes a low source/drain resistance switching device in an embodiment that utilizes non-recessed source/drain nodes.

FIG. 5 includes an embodiment similar to that of FIG. 1 (so similar components are not discussed again) but shows how source/drain regions 531, 533 may not be recessed. In other words, surface 536 indicates the original top surface of a fin possibly formed in a trench. Source/drain regions 531, 533 are merely grown on surface 536 instead of being formed below the surface 536 (surface 136 of FIG. 1). Thus, in FIG. 5, layer 102 includes a surface 536 and a surface 537 and "third layer" (analogous to layer 103 of FIG. 1) does not extend to a height that is between the surfaces 536, 357 (i.e., does not go below surface 536). Areas 531 and 533 may be referred to as raised source/drain nodes because they are not recessed and are higher than surface 536. N+GaAs below surface 537 may be referred to as "embedded" because the layer (e.g., a doped layer) below the channel.

Figure 6:
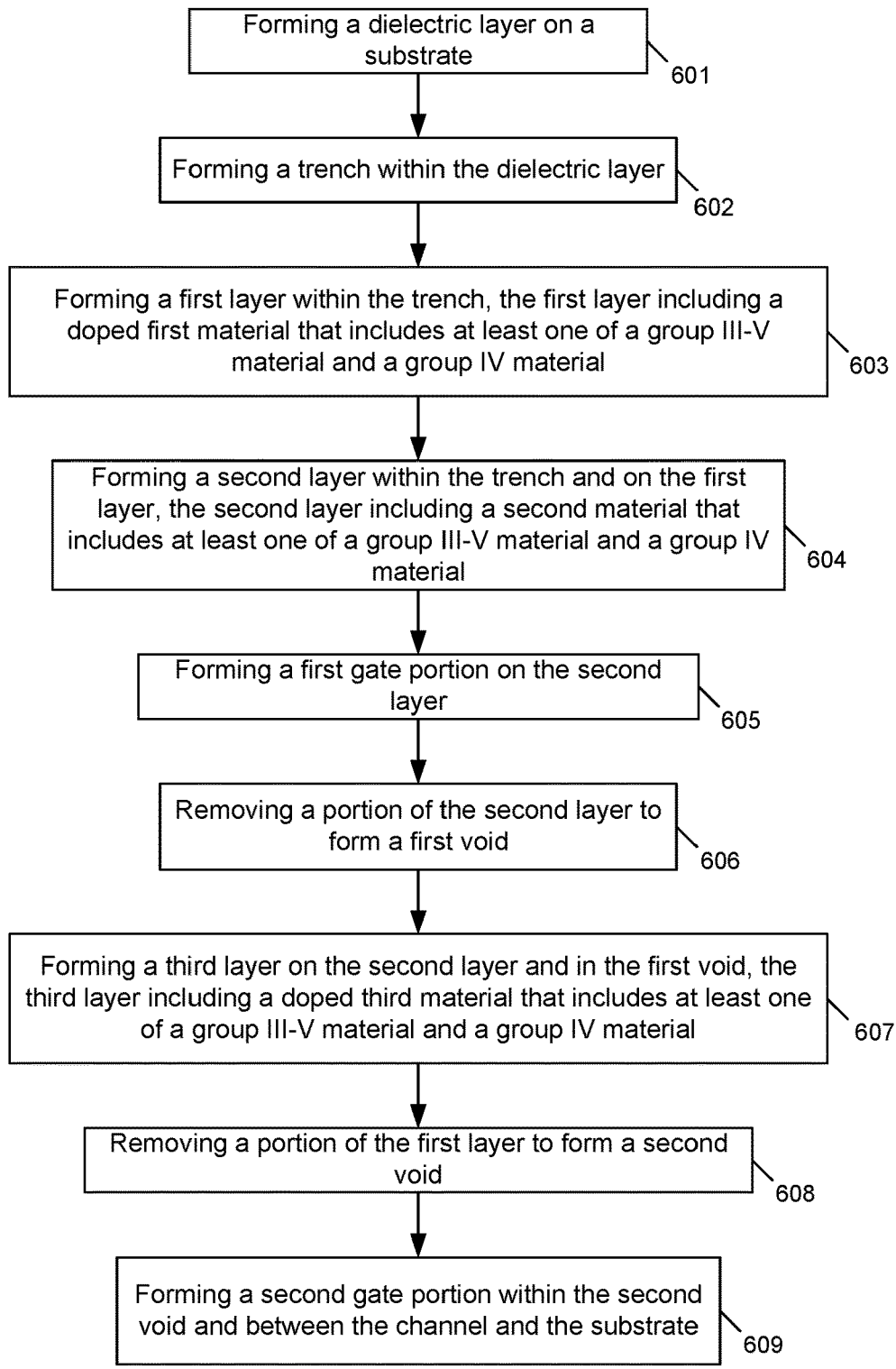
FIG. 6 includes a method of forming a low source/drain resistance switching device in an embodiment.

FIG. 6 includes a method for forming an embodiment. Block 601 includes forming a dielectric layer on a substrate. Block 602 includes forming a trench within the dielectric layer. Block 603 includes forming a first layer within the trench, the first layer (e.g., layer 101) including a doped first material that includes at least one of a group III-V material and a group IV material (e.g., growing N+ GaAs in buffer layer such as layer 101). Block 604 includes forming a second layer (e.g., layer 102) within the trench and on the first layer, the second layer including a second material that includes at least one of a group III-V material and a group IV material (e.g., growing InGaAs in layer such as layer 102). Block 605 includes forming a first gate portion on the second layer. This results in the embodiment of, for example, FIG. 2(*a*). Block 606 includes removing a portion of the second layer to form a first void. Block 607 includes forming a third layer on the second layer (e.g., using chemical vapor deposition (CVD)) and in the first void, the third layer including a doped third material that includes at least one of a group III-V material and a group IV material (e.g., growing N+InGaAs in layer such as layer 103). This results in the embodiment of, for example, FIG. 2(*b*) (performing shallow source/drain recess). Block 608 includes removing a portion of the first layer to form a second void. This results in the embodiment of, for example, FIG. 2(*c*) (removing polysilicon and etching out a portion of doped buffer layer under channel). Block 608 includes forming a second gate portion within the second void and between the channel and the substrate. This results in the embodiment of, for example, FIG. 2(*d*) (adding high-k/metal gate). In other words, an embodiment includes growing a layer (e.g., layer 103) after forming a gate. Then, the gate is removed along with a portion of a layer (e.g., layer 101) to form subfin void that is refilled with high-k metal gate.

In different embodiments a buffer layer may include the same materials (chemical composition/elements) as those in either of the doped layers but this is not true for all embodiments. Any layers below surface 537 can be called a buffer layer (even layer 101 itself is an N-doped buffer layer). The layers below layer 101 (for example layer 104) can be doped, un-doped, gradually-doped, or counter-doped oppositely of layer 101.

Thus, embodiments described herein provide reduction of source/drain resistance (Rext) using a doping layer (e.g., a pulse or delta doped layer) beneath a III-V source/drain. The doping layer is removed beneath the channel. This removal of doping material beneath the channel (a) avoids potential adverse effects on voltage threshold Vt (i.e., decreasing steepness of SG) caused by random doping fluctuations in layer 101, and (b) removes/reduces source-to-drain subfin leakage. Further, Rext is lowered without having to significantly recess the source/drain regions (as was the case previously) due to contributions from the doped layer below the channel (which reduce Rext). This is in contrast to previous solutions that require deep source/drain recess and heavily doped source/drain regrowth to reduce Rext. Using a doped layer (e.g., pulse-doped layer) beneath the source/drain (e.g., FIG. 4) or non-recessed source/drains (e.g., FIG. 5) improves charge supply and reduces Rext.

As mentioned above, another advantage entails reduced leakage current Ioff due to the shallow recess. For example, area 148 in FIG. 1 shows a junction between layers 102, 103 all in relative proximity to gate 111. This may cause an increase in Ioff due to band to band tunneling between the materials of layers 102, 103 in response to a signal supplied to gates 111, 112. However, Ioff is limited with a shallow recess of layer 103 because layer 103 joins layer 102 at a location (area 149) with a distance that relatively far from gate portion 112. Therefore, the influence of band to band tunneling may be experienced from gate portion 111 but not as much from gate portion 112.

Other advantages exist. For example, controlling the amount of etch or recess of source/drain regions can be difficult to ensure the recess does not go too far. This difficulty is lessened when the recess can be relatively shallower. Further, the consistency of recess among neighboring fins is also easier to control with the shallower recessing provided in embodiments.

Figure 7:
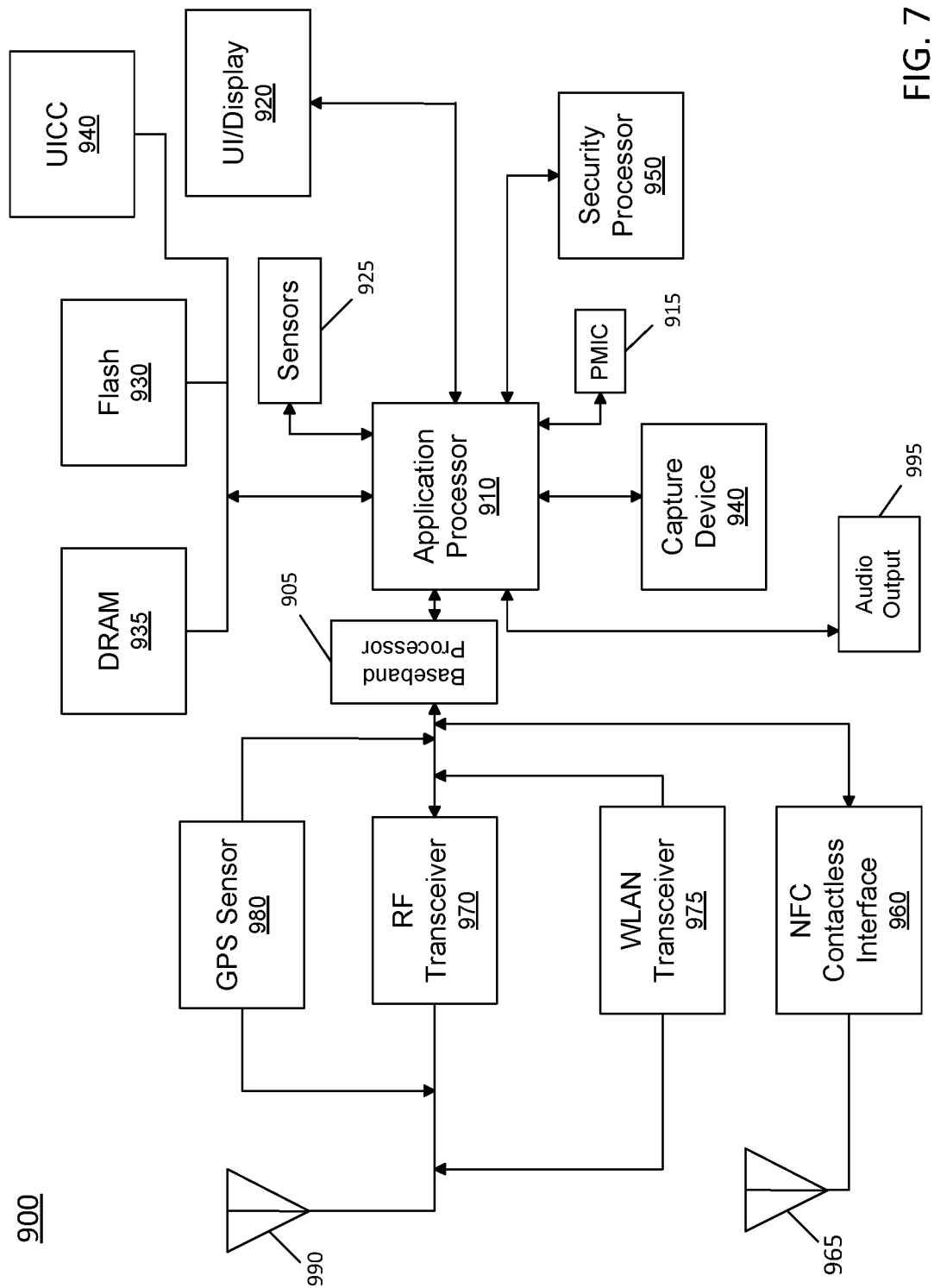
FIG. 7 includes a system that includes embodiments of switching devices described herein.

Referring now to FIG. 7, shown is a block diagram of an example system with which embodiments can be used. As seen, system 900 may be a smartphone or other wireless communicator or any other internet of things (IoT) device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Embodiments, such as FinFETs including embodiments described herein (e.g., FIGS. 1, 3, 4, 5) may be included in the above mentioned memories, processors, controllers, transceiver, and the like to thereby create switching devices with greater drive current and less leakage current—all of which can lead to more power efficient systems (e.g., longer battery life) for the system of FIG. 6 thereby adding value to the system.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a transistor comprising: first, second, and third layers each including a group III-V material; a channel included in the second layer, which is between the first and third layers; and a gate having first and second gate portions; wherein (a)(i) the first and third layers are doped, (a)(ii) the channel is between the first and second gate portions and the second gate portion is between the channel and a substrate, (a)(iii) a first axis intersects the first, second, and third layers but not the first gate portion, and (a)(iv) a second axis, parallel to the first axis, intersects the first and second gate portions and the channel.

Example 2 includes the transistor of example 1 wherein the second axis does not intersect the first and third layers.

Example 3 includes the transistor of example 2 wherein: the second layer includes a first half and a second half between the first half and the substrate; and the third layer does not extend to a height that is between any portion of the second half and the substrate.

Example 4 includes the apparatus of example 3 comprising a dielectric layer that includes a trench; wherein (b)(i) the trench comprises the first and second layers, and (b)(ii) the second and the third materials have the same chemical elements irrespective of doping elements included in the third layer.

Example 5 includes an apparatus comprising: a substrate; a first layer including a doped first material that includes at least one of a group III-V material and a group IV material; a second layer including a second material that includes at least one of a group III-V material and a group IV material; a third layer including a doped third material that includes at least one of a group III-V material and a group IV material; and a first gate portion; wherein: (a)(i) a first axis intersects the first, second, and third layers but not the first gate portion, (a)(ii) a second axis, parallel to the first axis, intersects the first gate portion and a channel, which is included in the second layer and which includes the second material, but does not intersect the first and third layers.

Thus, embodiments accommodate various types of devices such as those with channels having Si or SiGe. This helps address fin-based transistors that suffer from similar Rext issues (regardless of whether their channels include IV or III-V materials) in response to making fins taller and narrower. For example, as alternative embodiment to that shown in FIG. 1 would entail making the following changes to FIG. 1: layer 101 includes P+Si, layer 102 includes un-doped Ge, and layer 103 includes p+Ge. For another example, layer 101 includes P+Si, layer 102 includes un-doped SiGe, and layer 103 includes p-SiGe.

In embodiments the first and third layers may be doped with the same type dopant (e.g., either P-type for PMOS or N-type for NMOS).

Example 6 includes the apparatus of example 5 including a second gate portion between the channel and the substrate; wherein the second axis intersects the second gate portion.

Example 7 includes the apparatus of example 6 wherein: the second layer includes a first half and a second half that is between the first half and the substrate; a third axis, orthogonal to the second axis, intersects the first half and the third material included in the third layer; and a fourth axis, parallel to the third axis, intersects the second half but does not intersect the third material included in the third layer.

Example 8 includes the apparatus of example 7 wherein: the second and third materials have the same chemical elements irrespective of doping elements included in the third layer; and the second and third layers are not monolithic with each other.

Example 9 includes. The apparatus of example 8 wherein one of the first and second materials includes a chemical element that is not present in another of the first and second materials irrespective of doping elements included in the first layer.

Example 10 includes the apparatus of example 7 wherein the second layer is included in a nanowire and the first and second gate portions are included in a gate-all-around (GAA) gate.

Example 11 includes the apparatus of example 7 wherein the first layer has a height, defined by the first axis, of at least 1 nm.

Example 12 includes the apparatus of example 7 wherein the first layer has a height, defined by the first axis, of no more than 1 nm.

For example, this may include delta doping.

Example 13 includes the apparatus of example 7 comprising source and drain nodes included within the third layer and each including the third material.

Example 14 includes the apparatus of example 7 wherein: a fifth axis, parallel to the third axis, separates the first half from the second half; and the third layer does not extend to a height that is between the fourth and fifth axes.

Example 15 includes the apparatus of example 14 comprising a dielectric layer that includes a trench, wherein the first and second layers are included in the trench.

Example 16 includes the apparatus of example 15 comprising a fourth layer between the substrate and the first layer and a fifth layer between first and second layers; wherein the first axis intersects the fourth and fifth layers.

Example 17 includes the apparatus of example 7 wherein the first layer directly contacts the second layer.

Example 18 includes the apparatus of example 6 wherein: the second layer includes a first surface and a second surface between the first surface and the substrate; and the third layer does not extend to a height that is between the first and second surfaces.

Example 19 includes a system comprising: a memory; and a processor coupled to the memory, wherein at least one of the processor and the memory include a transistor according to any one of examples 1 to 18.

Another version of example 19 includes a system comprising: a computing device comprising a microprocessor comprising a plurality of circuit devices on a substrate, each of the plurality of circuit devices comprising: a substrate; and a transistor such as the transistor of examples 1 or 5.

Example 20 includes a method comprising: forming a dielectric layer on a substrate; forming a trench within the dielectric layer; forming a first layer within the trench, the first layer including a doped first material that includes at least one of a group III-V material and a group IV material; forming a second layer within the trench and on the first layer, the second layer including a second material that includes at least one of a group III-V material and a group IV material; forming a first gate portion on the second layer; forming a third layer on the second layer, the third layer including a doped third material that includes at least one of a group III-V material and a group IV material; and removing a portion of the first layer to form a void; wherein: (a)(i) a first axis intersects the first, second, and third layers but not the first gate portion, (a)(ii) a second axis, parallel to the first axis, intersects the first gate portion and a channel, which includes the second material, but does not intersect the first and third layers.

Example 21 includes the method of example 20 comprising forming a second gate portion within the void and between the channel and the substrate; wherein the second axis intersects the second gate portion.

Example 22 includes the method of example 21 comprising removing a portion of the second layer to form an additional void and forming the third layer within the additional void.

Example 23 includes the method of example 22 wherein: the second layer includes a first half and a second half between the first half and the substrate; and the third layer does not extend to a height that is between any portion of the second half and the substrate.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A transistor comprising:
   first, second, and third layers each including a group III-V material;
   a channel included in the second layer, which is between the first and third layers; and
   a gate having first and second gate portions;
   wherein: (a)(i) the first and third layers are doped, (a)(ii) the channel is between the first and second gate portions and the second gate portion is between the channel and a substrate, (a)(iii) a first axis intersects the first, second, and third layers but not the first gate portion, and (a)(iv) a second axis, parallel to the first axis, intersects the first and second gate portions and the channel.

2. The transistor of claim 1 wherein the second axis does not intersect the first and third layers.

3. The transistor of claim 2 wherein:
   the second layer includes a first half and a second half between the first half and the substrate; and
   the third layer does not extend to a height that is between any portion of the second half and the substrate.

4. The apparatus of claim 3 comprising a dielectric layer that includes a trench; wherein (b)(i) the trench comprises the first and second layers, and (b)(ii) second and third materials, which are respectively included in the second and third layers, have the same chemical elements irrespective of doping elements included in the third layer.

5. A system comprising:
   a memory; and
   a processor coupled to the memory,
   wherein at least one of the processor or the memory includes a transistor according to claim 1.

6. An apparatus comprising:
   a substrate;
   a first layer including a doped first material that includes at least one of a group III-V material, a group IV material, or combinations thereof;
   a second layer including a second material that includes at least one of a group III-V material, a group IV material, or combinations thereof;
   a third layer including a doped third material that includes at least one of a group III-V material, a group IV material, or combinations thereof; and
   a first gate portion;
   wherein: (a)(i) a first axis intersects the first, second, and third layers but not the first gate portion, (a)(ii) a second axis, parallel to the first axis, intersects the first gate portion and a channel, which is included in the second layer and which includes the second material, but does not intersect the first and third layers.

7. The apparatus of claim 6 including a second gate portion between the channel and the substrate; wherein the second axis intersects the second gate portion.

8. The apparatus of claim 7 wherein:
the second layer includes a first half and a second half that is between the first half and the substrate;
a third axis, orthogonal to the second axis, intersects the first half and the third material included in the third layer; and
a fourth axis, parallel to the third axis, intersects the second half but does not intersect the third material included in the third layer.

9. The apparatus of claim 8 wherein:
the second and third materials have the same chemical elements irrespective of doping elements included in the third layer; and
the second and third layers are not monolithic with each other.

10. The apparatus of claim 9 wherein one of the first or second materials includes a chemical element that is not present in another of the first or second materials irrespective of doping elements included in the first layer.

11. The apparatus of claim 7 wherein:
the second layer includes a first surface and a second surface between the first surface and the substrate; and
the third layer does not extend to a height that is between the first and second surfaces.

12. The apparatus of claim 8 wherein the second layer is included in a nanowire and the first and second gate portions are included in a gate-all-around (GAA) gate.

13. The apparatus of claim 8 wherein the first layer has a height, defined by the first axis, of at least 1 nm.

14. The apparatus of claim 8 wherein the first layer has a height, defined by the first axis, of no more than 1 nm.

15. The apparatus of claim 8 comprising source and drain nodes included within the third layer and each including the third material.

16. The apparatus of claim 8 wherein:
a fifth axis, parallel to the third axis, separates the first half from the second half; and
the third layer does not extend to a height that is between the fourth and fifth axes.

17. The apparatus of claim 16 comprising a dielectric layer that includes a trench, wherein the first and second layers are included in the trench.

18. The apparatus of claim 17 comprising a fourth layer between the substrate and the first layer and a fifth layer between first and second layers; wherein the first axis intersects the fourth and fifth layers.

19. The apparatus of claim 8 wherein the first layer directly contacts the second layer.

20. A method comprising:
forming a dielectric layer on a substrate;
forming a trench within the dielectric layer;
forming a first layer within the trench, the first layer including a doped first material that includes at least one of a group III-V material, a group IV material, or combinations thereof;
forming a second layer within the trench and on the first layer, the second layer including a second material that includes at least one of a group III-V material, a group IV material, or combinations thereof;
forming a first gate portion on the second layer;
forming a third layer on the second layer, the third layer including a doped third material that includes at least one of a group III-V material, a group IV material, or combinations thereof; and
removing a portion of the first layer to form a void;
wherein: (a)(i) a first axis intersects the first, second, and third layers but not the first gate portion, (a)(ii) a second axis, parallel to the first axis, intersects the first gate portion and a channel, which includes the second material, but does not intersect the first and third layers.

21. The method of claim 20 comprising forming a second gate portion within the void and between the channel and the substrate; wherein the second axis intersects the second gate portion.

22. The method of claim 21 comprising removing a portion of the second layer to form an additional void and forming the third layer within the additional void.

23. The method of claim 22 wherein:
the second layer includes a first half and a second half between the first half and the substrate; and
the third layer does not extend to a height that is between any portion of the second half and the substrate.

* * * * *